(12) United States Patent
Anderson et al.

(10) Patent No.: US 8,492,214 B2
(45) Date of Patent: Jul. 23, 2013

(54) DAMASCENE METAL GATE AND SHIELD STRUCTURE, METHODS OF MANUFACTURE AND DESIGN STRUCTURES

(75) Inventors: Brent A. Anderson, Jericho, VT (US); Andres Bryant, Burlington, VT (US); William F. Clark, Jr., Essex Junction, VT (US); John J. Ellis-Monaghan, Grand Isle, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 13/051,510

(22) Filed: Mar. 18, 2011

(65) Prior Publication Data

US 2012/0235216 A1    Sep. 20, 2012

(51) Int. Cl.
*H01L 21/338* (2006.01)

(52) U.S. Cl.
USPC ......................................... 438/183

(58) Field of Classification Search
None
See application file for complete search history.

(56) References Cited

U.S. PATENT DOCUMENTS

| | | | |
|---|---|---|---|
| 4,789,888 A | 12/1988 | Miyata et al. | |
| 5,262,871 A | 11/1993 | Wilder et al. | |
| 5,371,033 A | 12/1994 | Lee et al. | |
| 5,843,847 A * | 12/1998 | Pu et al. | 438/723 |
| 6,107,211 A | 8/2000 | Tseng | |
| 6,160,282 A | 12/2000 | Merrill | |
| 6,198,087 B1 | 3/2001 | Boon | |
| 6,278,169 B1 | 8/2001 | Sayuk et al. | |
| 6,504,195 B2 | 1/2003 | Guidash | |
| 6,531,266 B1 | 3/2003 | Chang et al. | |
| 6,627,929 B2 | 9/2003 | Shim et al. | |
| 6,744,526 B2 | 6/2004 | McDermott et al. | |
| 6,847,051 B2 | 1/2005 | Hong | |
| 6,878,919 B1 | 4/2005 | Nichols et al. | |
| 6,930,337 B2 | 8/2005 | Rhodes | |
| 7,071,529 B2 * | 7/2006 | Miyagawa et al. | 257/501 |
| 7,102,185 B2 | 9/2006 | Nichols et al. | |
| 7,633,106 B2 | 12/2009 | Adkisson et al. | |
| 2005/0112811 A1 * | 5/2005 | Hsu et al. | 438/197 |
| 2005/0153492 A1 * | 7/2005 | Ahmed et al. | 438/183 |
| 2006/0121640 A1 | 6/2006 | Kim | |
| 2009/0159978 A1 * | 6/2009 | Matsubara et al. | 257/368 |
| 2011/0084314 A1 * | 4/2011 | Or-Bach et al. | 257/209 |

* cited by examiner

*Primary Examiner* — Charles Garber
*Assistant Examiner* — Andre' C Stevenson
(74) *Attorney, Agent, or Firm* — Anthony Canale; Roberts Mlotkowski Safran & Cole, P.C.

(57) ABSTRACT

Semiconductor structures with damascene metal gates and pixel sensor cell shields, methods of manufacture and design structures are provided. The method includes forming a dielectric layer over a dummy gate structure. The method further includes forming one or more recesses in the dielectric layer. The method further includes removing the dummy gate structure in the dielectric layer to form a trench. The method further includes forming metal in the trench and the one more recesses in the dielectric layer to form a damascene metal gate structure in the trench and one or more metal components in the one or more recesses.

13 Claims, 5 Drawing Sheets

DAMASCENE METAL GATE AND SHIELD STRUCTURE, METHODS OF MANUFACTURE AND DESIGN STRUCTURES

FIELD OF THE INVENTION

The invention relates to semiconductor structures and methods of manufacture and, more particularly, to semiconductor structures with damascene metal gates and pixel sensor cell shields, methods of manufacture and design structures.

BACKGROUND

Pixel sensor cells as well as other CMOS devices have sensitive components that require some degree of shielding in order to reduce, e.g., noise. For example, in pixel sensor cells, active pixel sensor cells include photodiodes combined with a number of active transistors which, in addition to forming an electrical signal, provide amplification, readout control, and reset control. However, stray light can strike sensitive areas of the active transistors, storage areas, etc. resulting in unwanted noise.

To control this noise, CMOS processes require metal lines to be formed in upper back end of the line metal layers, located above the active transistors, storage areas, etc. These metal lines shield sensitive regions from light, which would otherwise be absorbed causing degraded performance through mechanisms such as color crosstalk, smear, or reduced blooming control. Obviously, this is undesirable.

However, many issues exist. By way of example, the formation of the metal wires require additional, expensive metal fabrication processes. Also, these metal lines are formed on upper metal wiring layers, which require considerable space, thereby reducing the space for other critical components, wires, interconnects, etc. For example, in currently available CMOS fabrication processes, the transistors are formed at a first level and the metal lines are formed at upper metal wiring levels. However, these upper levels are typically used for back end of the line components. Also, as the metal lines are formed in these upper layers, incident or stray light can still strike sensitive areas, resulting in noise and hence performance degradation.

Accordingly, there exists a need in the art to overcome the deficiencies and limitations described hereinabove.

SUMMARY

In a first aspect of the invention, a method comprises forming a dielectric layer over a dummy gate structure. The method further comprises forming one or more recesses in the dielectric layer. The method further comprises removing the dummy gate structure in the dielectric layer to form a trench. The method further comprises forming metal in the trench and the one more recesses in the dielectric layer to form a damascene metal gate structure in the trench and one or more metal components in the one or more recesses.

In another aspect of the invention, a structure comprises a damascene metal gate and metal shield for pixel sensor cells in a same dielectric layer, above a sensitive component of a pixel sensor cell. The metal shield for pixel sensor cells are formed in shallow recesses in the dielectric layer and the damascene metal gate is formed in a trench extending to an underlying substrate formed under the dielectric layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structure with pixel sensor cell shields, which comprises the structures of the present invention. In still further embodiments, a method in a computer-aided design system is provided for generating a functional design model of the structure with pixel sensor cell shields. The method comprises generating a functional representation of the structural elements of the structure with pixel sensor cell shields.

More specifically, in an aspect of the invention, a hardware description language (HDL) design structure is encoded on a machine-readable data storage medium. The HDL design structure comprises elements that when processed in a computer-aided design system generates a machine-executable representation of a damascene metal gate and metal shield structure on a same device level. The HDL design structure comprises: a damascene metal gate and metal shield for pixel sensor cells in a same dielectric layer, above a sensitive component of a pixel sensor cell, wherein the metal shield for pixel sensor cells are formed in shallow recesses in the dielectric layer and the damascene metal gate is formed in a trench extending to an underlying substrate formed under the dielectric layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to semiconductor structures with damascene metal gates and pixel sensor cell shields (and/or wiring), methods of manufacture and design structures. More specifically, in one non-limiting illustrative example, the present invention is directed to pixel sensor cells with pixel sensor cell shields formed at a same level and in the same processing steps as a damascene metal gate. The pixel sensor cell shields are structured and positioned to reduce noise in the pixel sensor cell. For example, in embodiments, the pixel sensor cell shields will block light from striking sensitive regions in the pixel sensor cells such as, for example, floating diffusions or other critical components that require shielding from light, thereby reducing unwanted noise.

Advantageously, the pixel sensor cell shields can be formed during metal gate formation. That is, the metal gate and the pixel sensor cell shields can be formed during a same processing step, which eliminates additional, expensive metal fabrication steps that would otherwise be needed to fabricate upper metal wires used to block light, i.e., reduce noise. Also, by implementing the present invention, it is now possible to place a light shield at a lower level in the structure, i.e., close to the substrate, thereby providing improved light blockage. For example, the placement of the pixel sensor cell shields at a lower level in the stack prevents stray light from entering at the sides of the shield, since the incident angle is now much shallower than with conventional shields placed at higher wiring levels. Moreover, as the pixel sensor cell shields are now at a same level as the metal gate, the upper metal layers, Mx, Mx+1, etc., can be used more efficiently for metal wiring and other back end of the line devices and structures. More particularly, additional wiring access at the upper metal wiring levels is achieved by placing the pixel sensor cell shields (or other wiring) at a same level as the metal gate.

Figure 1:
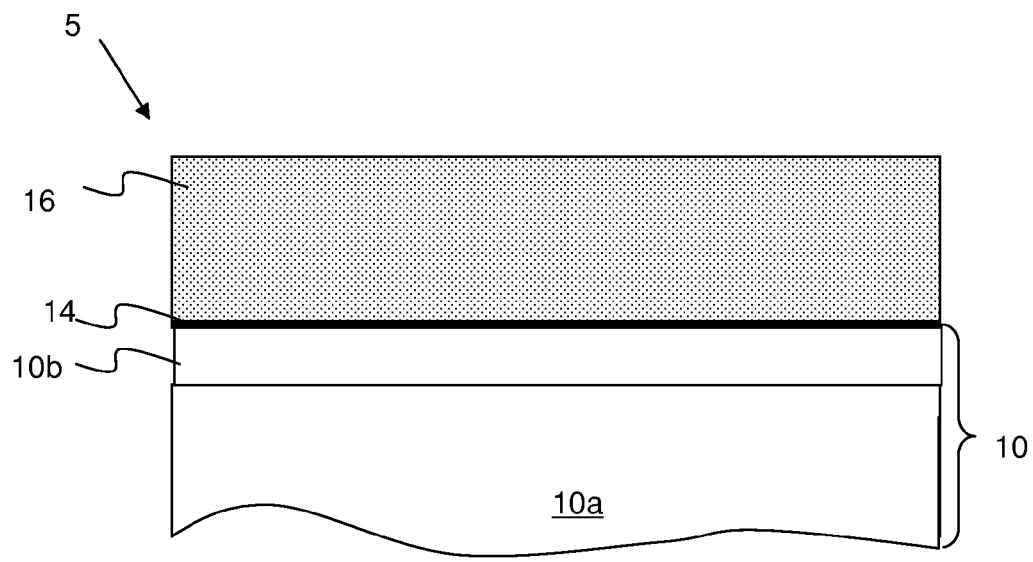
FIG. 1 shows a beginning structure and respective processing steps in accordance with aspects of the present invention.

FIG. 1 shows a beginning structure and respective processing steps in accordance with aspects of the present invention. More specifically, FIG. 1 shows a beginning structure 5 comprising a wafer 10. In embodiments, the wafer 10 may comprise a bulk silicon or silicon on insulator (SOI) wafer. In the SOI implementation, the wafer 10 comprises semiconductor layer 10b (e.g., active silicon) formed over an insulation layer 10a. In the bulk silicon implementation, reference numeral 10a can be representative of any isolation region or junction isolation.

The constituent materials of the SOI wafer 10 may be selected based on the desired end use application of the semiconductor device. For example, the buried insulation region 10a may be composed of oxide, such as $SiO_2$, and may be referred to as BOX layer. Moreover, although the SOI wafer is referred to as "silicon on insulator," the semiconductor layer 10b is not limited to silicon. Instead, the semiconductor layer 10b may be comprised of various semiconductor materials, such as, for example, Si, SiGe, SiC, SiGeC, etc. The SOI wafer 10 may be fabricated using techniques well known to those skilled in the art. For example, the SOI wafer 10 may be formed by conventional processes including, but not limited to, oxygen implantation (e.g., SIMOX), wafer bonding, etc. Active devices such as CMOS transistors can be formed in the semiconductor layer 10b.

Still referring to FIG. 1, a dielectric layer 14 may be formed on the semiconductor layer 10b, e.g., in direct contact with the semiconductor layer 10b. In embodiments, the dielectric layer 14 can be a sacrificial dielectric layer, composed of any insulator material such as, for example, oxide. In additional embodiments, the dielectric layer 14 can be a permanent dielectric layer, comprising any stack of insulator materials, appropriate for a particular application. For example, the dielectric layer 14 can be a stack of high-k dielectric material including hafnium based materials such as, for example, hafnium oxide, and/or silicon oxy nitride. The dielectric layer 14 can also be formed by any conventional chemical vapor deposition (CVD) process. A polysilicon layer 16 is formed on the dielectric layer 14 using, for example, a CVD process.

Figure 2:
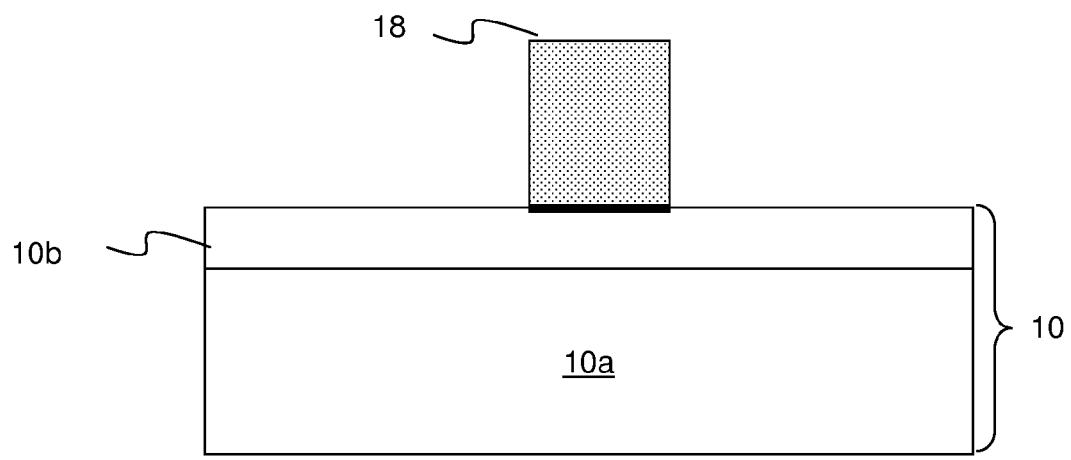
FIGS. 2-7 show processing steps and respective structures in accordance with aspects of the present invention.

FIG. 2 shows additional processing steps and respective structure in accordance with aspects of the present invention. More specifically, FIG. 2 shows the formation of a dummy gate 18. In embodiments, the dummy gate 18 can be formed using conventional lithographic and etching processes. For example, the lithography step may entail applying a photoresist, exposing the photoresist to a pattern of radiation, and developing the pattern utilizing a conventional resist developer. Following the lithography step, a conventional etching process such as reactive-ion etching (RIE) may be employed in transferring the pattern to the dummy gate 18.

Figure 3:
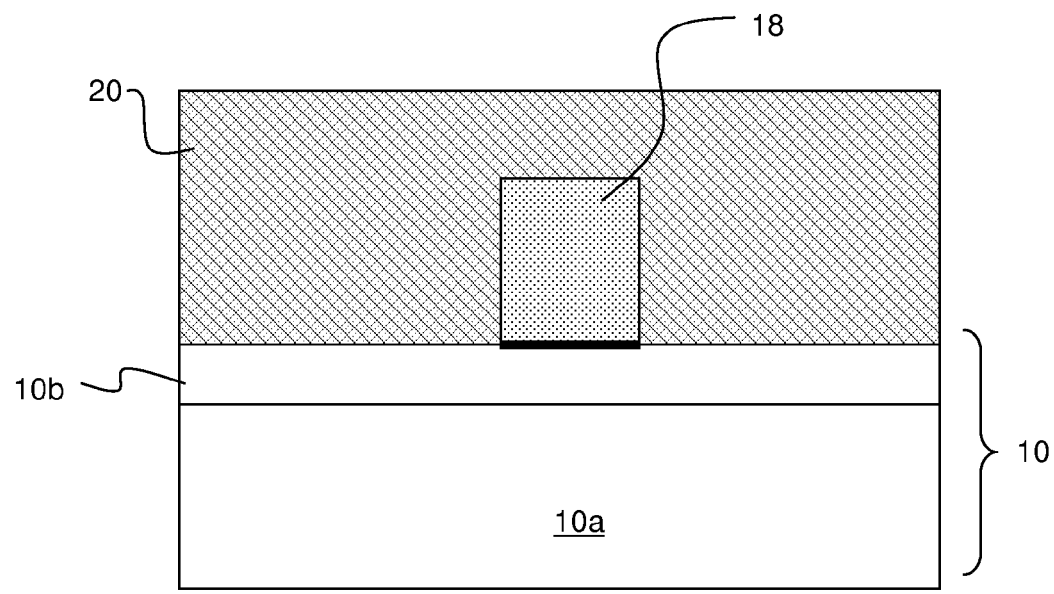

In FIG. 3, a dielectric material (e.g., dielectric stack) 20 is formed over the dummy gate 18. In embodiments, the dielectric material 20 comprises any conventional inter-level dielectric material such as, for example, oxide. In embodiments, the dielectric material 20 is deposited using conventional deposition methods such as, for example, CVD. The dielectric material 20 can completely surround the dummy gate 18.

Figure 4:
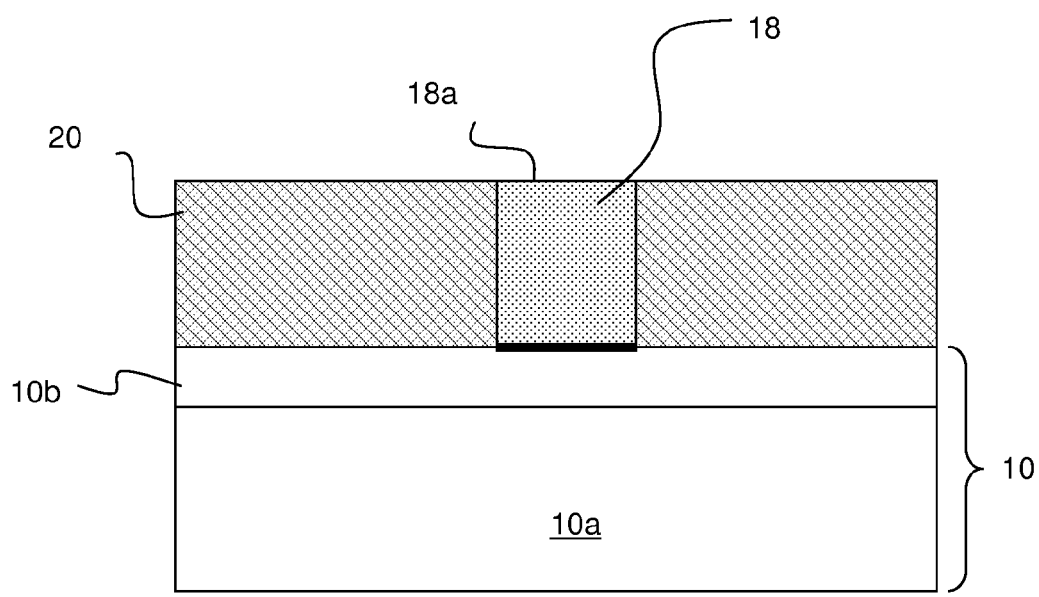

In FIG. 4, the dielectric material 20 is polished to expose a top surface 18a of the dummy gate 18. In embodiments, the top surface 18a of the dummy gate 18 can also be polished. The polishing can be any conventional polishing process such as, for example, chemical mechanical polishing.

Figure 5:
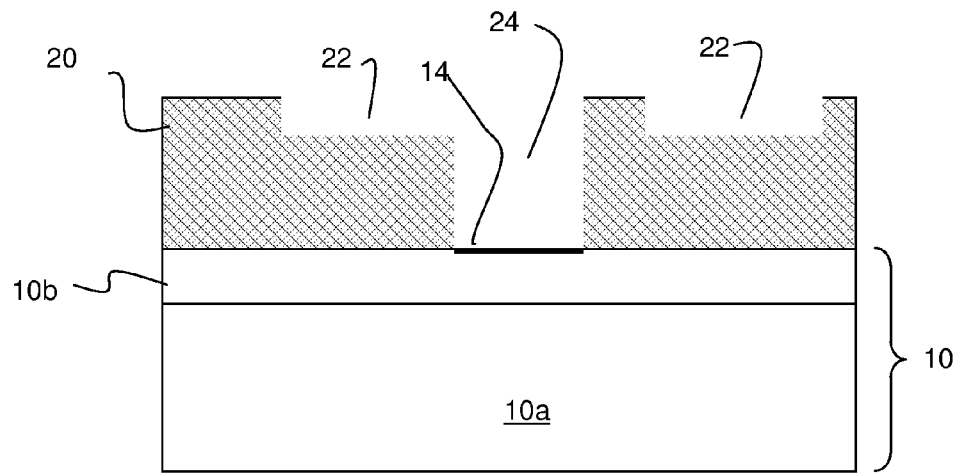

As shown in FIG. 5, recesses 22 are formed in the dielectric material 20. The recesses 22 can be formed using any conventional lithographic and etching processes, as discussed above. In embodiments, the recesses 22 can be formed independent of the dummy gate (e.g., trenches 24) or directly in contact with the dummy gate. In further embodiments, the recesses 22 are formed over sensitive components/devices such as, for example, floating diffusions or other sensitive components of a pixel sensor cell in which light would affect the signal. In further embodiments, the recesses 22 can be formed about peripheries of such sensitive components/devices, even including, in embodiments, around portions or an entirety of a perimeter of the photodiode. In embodiments, the recesses 22 should not be formed directly over the light sensitive portions of the photodiode, as this will ensure that light can be captured by the photodiode in order to generate a signal.

The recesses 22 are designed as a percentage of the height of the dummy gate. For example, in embodiments, the recesses 22 can be about 25% to 75% of the height of the dummy gate; although other dimensions are also contemplated by the present invention. As an illustrative example, the recesses 22 can be about 40 nm in depth, which would require a 100 nm high dummy gate. In embodiments, advantageously, the remaining thickness of the dielectric material 20 between the layer 10b and the recesses 22 can reduce capacitance of the structure.

Still referring to FIG. 5, the dummy gate 18 can also be removed to form one or more trenches 24. The dummy gates can be removed using a selective chemistry to the polysilicon. That is, the removal process will remove dummy gate material at a higher removal rate than the dielectric material 20 and the dielectric layer 14. In embodiments, the dielectric layer 14 can also be removed; although, it is contemplated that the dielectric layer 14 will remain at the bottom of the trench 24. In one preferred embodiment, the recesses 22 are formed prior to the formation of the trench 24 so as to prevent any contamination in the transistor region.

Figure 6:
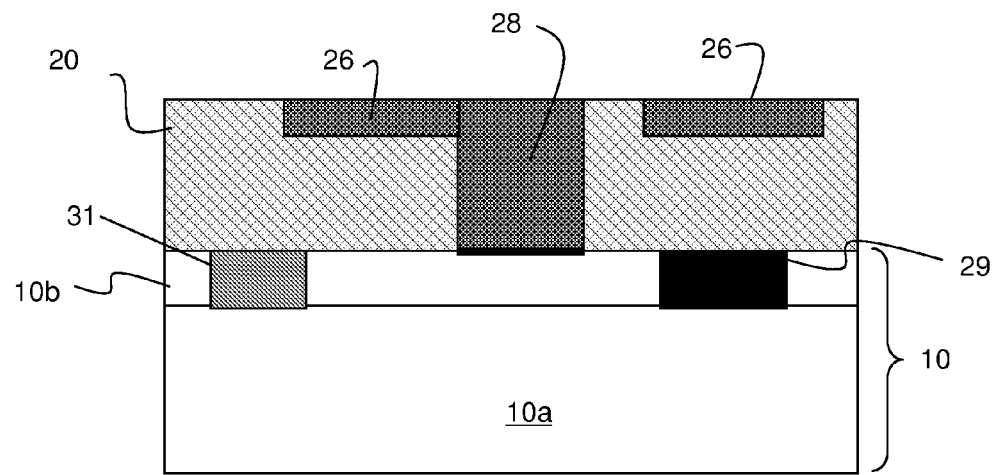

As shown in FIG. 6, the recesses and the trench are filled with a metal during a same processing step to form pixel sensor cell shields 26 and a metal gate 28 (at a same level). The use of the same processing step eliminates expensive metal fabrication steps that would otherwise be needed to fabricate metal wires typically used to block light, i.e., reduce noise. The metal can be planarized in order to form discrete, separate metal patterns.

In embodiments, the metal can be any gate metal or combination of gate metals such as, for example, titanium, titanium nitride and/or aluminum. As should be understood by those of skill in the art, the metals can be adjusted for specific work functions. In any scenario, the metals can be formed using any conventional deposition methods such as, for example, metal sputtering. In embodiments, the metal within the trench can be deposited directly on the dielectric layer 14; however, if the dielectric layer was previously removed during the formation of the trench, the present invention contemplates the deposition of a new dielectric layer(s) prior to the deposition of the metal gate layer. In embodiments, the metal layer can be polished.

As shown in FIG. 6, in embodiments, the pixel sensor cell shields 26 can be formed near (above) sensitive components/devices such as, for example, floating diffusions, sensitive components of a pixel sensor cell in which light would affect the signal or other critical logic (represented at reference numeral 29). In further embodiments, the pixel sensor cell shields 26 can be formed about peripheries (edges or portions thereof) of such sensitive components/devices, even including, in embodiments, around portions or an entirety of a perimeter of the photodiode 31. In embodiments, the pixel sensor cell shields 26 can even slightly overlap the edges of the photodiode 31 or critical logic circuits. As should now be understood by those of skill in the art, the pixel sensor cell shields 26 will prevent stray light from striking the sensitive components, e.g., sensitive portions of the pixel sensor cell, thereby reducing overall noise. Also, due to the sufficient separation of the pixel sensor cell shields 26 from the underlying structures, parasitic capacitance between the shields 26 and the substrate 10*b* can be reduced.

Figure 7:
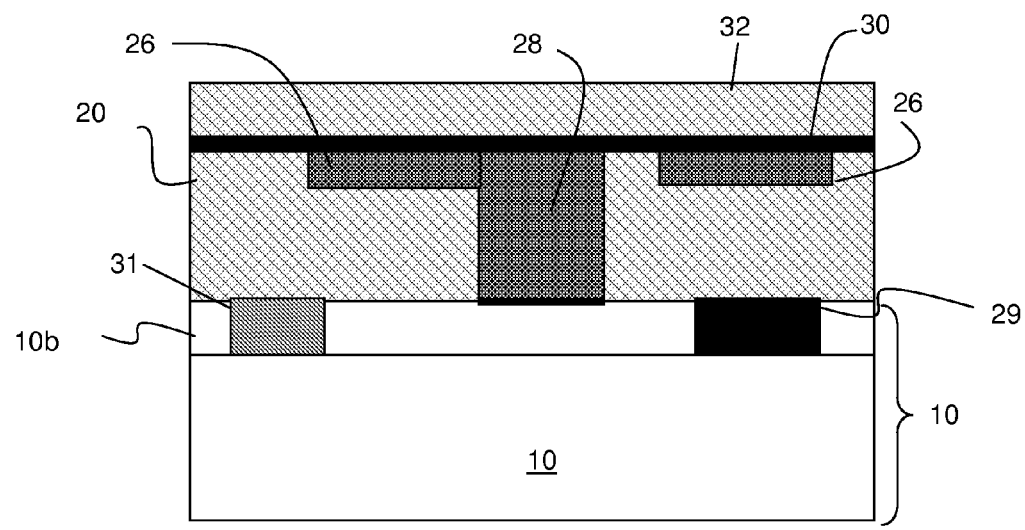

In FIG. 7, a capping layer 30 is formed over the pixel sensor cell shields 26 and the metal gate 28. In embodiments, the capping layer 30 can be, for example, a SiN capping layer. The capping layer 30 can be formed using any conventional deposition method such as, for example, CVD. Back end of the line (BEOL) layer(s) 32 are formed on the capping layer 30. The BEOL layer(s) 32 can be any upper wiring layer, used for the formation of interconnects, wirings, dual damascene copper layers, etc.

Figure 8:
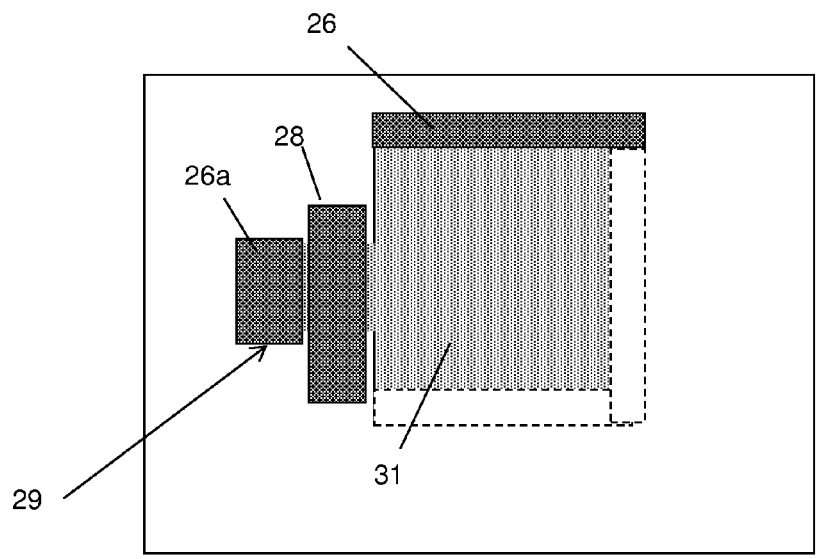
FIG. 8 shows a top view of a structure formed in accordance with the methods of the present invention.

FIG. 8 shows a top view of a structure formed in accordance with the methods of the present invention. As shown in this view, the pixel sensor cell shields 26 are provided at strategic locations around a edges (represented by the dashed lines) or portions thereof of a structure, e.g., photodiode 31, or as shown at reference numeral 26*a* above an entirety or substantially an entirety of other critical logic circuits such as, for example, floating diffusions 29. In the implementation of the floating diffusions, the pixel sensor cell shields 26*a* can cover the entirety of the collection region in order to prevent stray light from entering such sensitive areas. The pixel sensor cell shields 26 are also located near the metal gate 28, at the same level.

Figure 9:
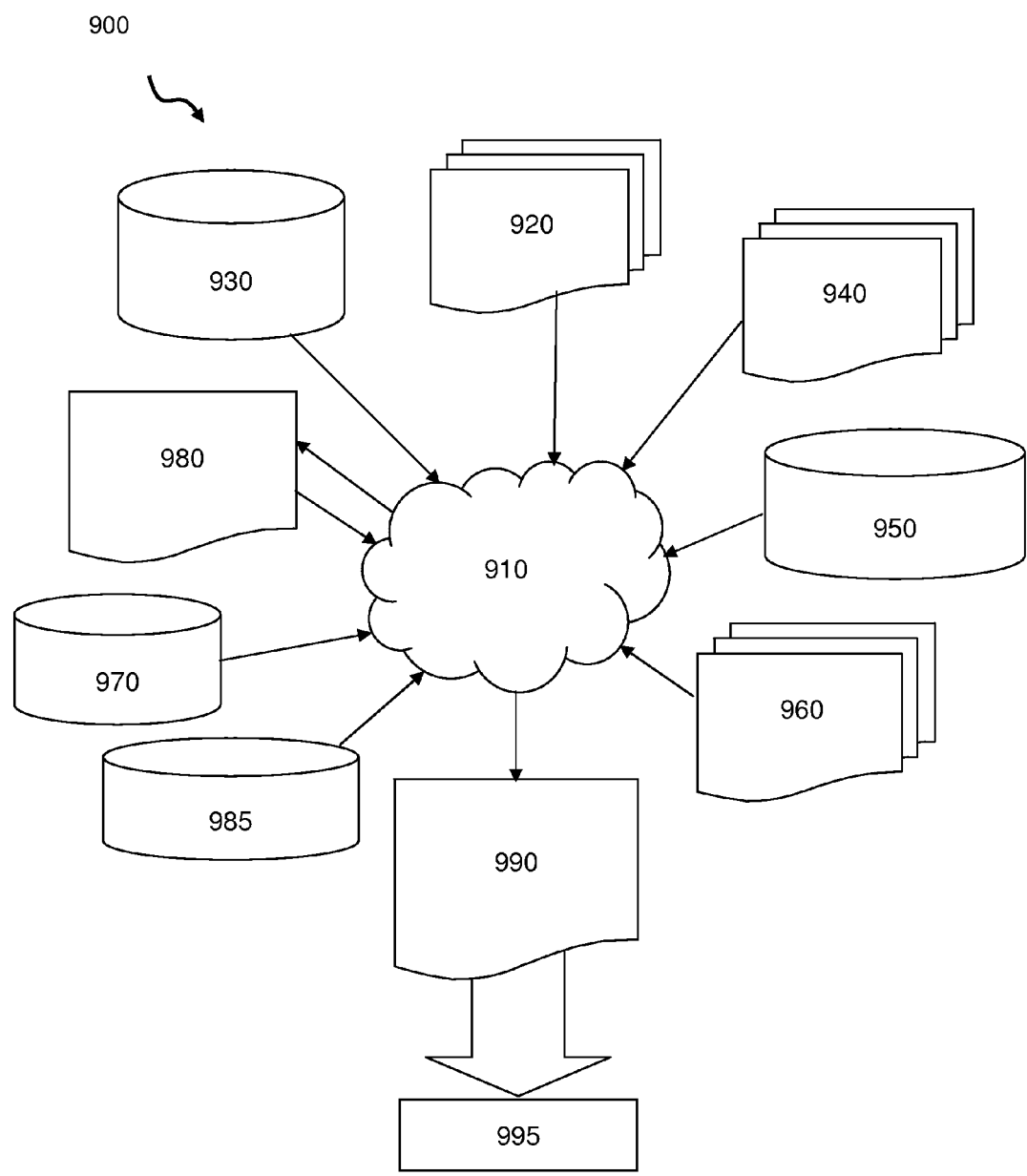
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method comprising:
   forming a dielectric layer over a dummy gate structure;
   forming one or more recesses in the dielectric layer;
   removing the dummy gate structure in the dielectric layer to form a trench; and
   forming metal in the trench and the one more recesses in the dielectric layer to form a damascene metal gate structure in the trench and one or more metal components in the one or more recesses in the dielectric layer, wherein the one or more metal components are pixel sensor cell shields formed over sensitive areas of a pixel sensor cell.

2. The method of claim 1, wherein the dummy gate structure is formed by:
   depositing insulator material on a substrate;
   depositing polysilicon on the insulator material; and
   patterning the insulator material and the polysilicon using lithographic and etching processes.

3. The method of claim 1, wherein the removing the dummy gate structure to form the trench comprises a selective chemistry.

4. The method of claim 3, wherein the forming of the one or more recesses comprises an etching process.

5. The method of claim 1, wherein the forming the metal in the trench and the one or more recesses is formed at a same level above a substrate, and during a same metal deposition processing step.

6. A method comprising:
forming a dielectric layer over a dummy gate structure;
forming one or more recesses in the dielectric layer;
removing the dummy gate structure in the dielectric layer to form a trench;
forming metal in the trench and the one more recesses in the dielectric layer to form a damascene metal gate structure in the trench and one or more metal components in the one or more recesses in the dielectric layer; and
planarizing the metal to form separate metal components comprising the damascene metal gate structure and one or more pixel sensor cell shields,
wherein the forming the metal in the trench and the one or more recesses is formed at a same level above a substrate, and during a same metal deposition processing step.

7. A method comprising:
forming a dielectric layer over a dummy gate structure;
forming one or more recesses in the dielectric layer;
removing the dummy gate structure in the dielectric layer to form a trench; and
forming metal in the trench and the one more recesses in the dielectric layer to form a damascene metal gate structure in the trench and one or more metal components in the one or more recesses in the dielectric layer,
wherein the forming one or more recesses in the dielectric layer is performed prior to the removing of the dummy gate structure.

8. A method comprising:
forming a dielectric layer over a dummy gate structure;
forming one or more recesses in the dielectric layer;
removing the dummy gate structure in the dielectric layer to form a trench; and
forming metal in the trench and the one more recesses in the dielectric layer to form a damascene metal gate structure in the trench and one or more metal components in the one or more recesses in the dielectric layer,
wherein the one or more recesses are formed by an etching of the dielectric layer to about 25% to about 75% of a depth of the trench.

9. The method of claim 1, wherein the sensitive areas include a floating diffusion.

10. The method of claim 1, wherein the removing the dummy gate structure comprises planarazing the dielectric layer to expose a top surface of the dummy gate structure and removing the dummy gate structure with an etching.

11. A method comprising:
forming a dielectric layer over a dummy gate structure;
forming one or more recesses in the dielectric layer;
removing the dummy gate structure in the dielectric layer to form a trench;
forming metal in the trench and the one more recesses in the dielectric layer to form a damascene metal gate structure in the trench and one or more metal components in the one or more recesses in the dielectric layer; and
forming a cap layer on the damascene metal gate structure and the one or more metal components.

12. The method of claim 11, further comprising processing back end of line components over the cap layer.

13. A method comprising:
forming a dielectric layer over a dummy gate structure;
forming one or more recesses in the dielectric layer;
removing the dummy gate structure in the dielectric layer to form a trench; and
forming metal in the trench and the one more recesses in the dielectric layer to form a damascene metal gate structure in the trench and one or more metal components in the one or more recesses in the dielectric layer, wherein:
the dummy gate structure is formed on a substrate, the forming of the dummy gate structure comprises:
depositing a dielectric material on the substrate;
depositing polysilicon on the dielectric material; and
performing lithographic and etching processes to pattern the dummy gate structure;
the dielectric layer is deposited over the dummy gate structure and the substrate, wherein the dielectric layer is planarized to expose a surface of the dummy gate structure;
the forming one or more recesses in the dielectric layer comprises etching into the dielectric layer above the substrate;
the removing the dummy gate structure in the dielectric layer to form the trench comprises a selective chemistry to remove dummy gate material at a higher removal rate than the dielectric material and the dielectric layer, wherein the forming the one or more recesses is performed prior to the removing of the dummy gate structure;
the forming metal in the trench and the one more recesses is performed simultaneously to form the damascene metal gate structure in the trench and the one or more metal components include one or more pixel sensor cell shields; and
further comprising planarizing the metal to form discrete metal components including the damascene metal gate structure in the trench and the one or more pixel sensor cell shields.

* * * * *